United States Patent [19]

Hashizume et al.

[11] 4,407,887

[45] Oct. 4, 1983

[54] POLYVINYLIDENE FLUORIDE FILM HAVING SUPERIOR DIELECTRIC STRENGTH AND A PROCESS FOR PRODUCING THE SAME

[75] Inventors: Hideyuki Hashizume; Tadashi Tsuchiya, both of Iwaki, Japan

[73] Assignee: Kureha Kagaku Kogyo Kabushiki Kaisha, Tokyo, Japan

[21] Appl. No.: 24,802

[22] Filed: Mar. 28, 1979

[30] Foreign Application Priority Data

Mar. 31, 1978 [JP] Japan .................................. 53-36588

[51] Int. Cl.$^3$ ....................... B32B 27/00; B32B 27/36; B29C 19/02
[52] U.S. Cl. .................................. 428/332; 156/272.2; 427/44; 428/336; 428/412; 428/413; 428/421; 428/473.5; 428/476.3; 428/483; 428/515; 428/516; 428/518; 428/520; 526/255

[58] Field of Search ............... 428/412, 413, 421, 474, 428/483, 515, 516, 518, 520, 476.3, 473.5, 332, 336; 526/255; 427/44; 156/272.2

[56] References Cited

U.S. PATENT DOCUMENTS

| | | | |
|---|---|---|---|
| 3,917,895 | 11/1975 | Bosniack | 428/421 |
| 3,931,446 | 1/1976 | Murayama et al. | 428/421 |
| 3,935,159 | 1/1976 | Demillecamps et al. | 428/421 X |
| 3,993,842 | 11/1976 | Hirsch et al. | 428/421 |
| 4,011,874 | 3/1977 | Segawa et al. | 428/421 X |
| 4,095,020 | 6/1978 | Prest et al. | 428/421 X |

Primary Examiner—Thomas J. Herbert, Jr.
Attorney, Agent, or Firm—Sughrue, Mion, Zinn, Macpeak & Seas

[57] ABSTRACT

A polyvinylidene fluoride film having a high dielectric strength of at least 10 MV/cm at room temperature and at least 8 MV/cm at 100° C. and a process for producing the same.

15 Claims, No Drawings

POLYVINYLIDENE FLUORIDE FILM HAVING SUPERIOR DIELECTRIC STRENGTH AND A PROCESS FOR PRODUCING THE SAME

BACKGROUND OF THE INVENTION

1. Field of the Invention

This invention relates to a polyvinylidene fluoride film having high dielectric strength and to a process for producing said film.

2. Discussion of the Prior Art

Polyvinylidene fluoride films are unique dielectric materials having piezoelectric and pyroelectric properties as well as a high dielectric constant. It has been desired to increase their dielectric strength in order to improve their electric properties. However, because the dielectric breakdown phenomenon of polyvinylidene fluoride films is complex as compared with other polymeric films, it is extremely difficult to increase the dielectric strength of such film. The results of early investigations have shown that when foreign materials of visible size, popularly called "fish eyes", are present in a polyvinylidene fluoride film, dielectric breakdown occurs at the sites of these visible foreign materials. However, breakdown is known to occur elsewhere and there are quite a few theories for the dielectric breakdown which occurs at the other sites in the film where no such visible foreign material exists, but no definite cause has yet been determined. One possible explanation is the presence of invisible minute foreign materials which can be located by an optical microscope. Voids or scratches generated during molding, and ionic impurities generated by decomposition during polymerization or molding have also been considered to be causes. It is thought that since the dielectric strength of a conventional polyvinylidene fluoride film is 8 MV/cm at room temperature and 6 MV/cm at 100° C. which is higher than that of other polymers, the dielectric strength of polyvinylidene fluoride films has reached an upper limit and further improvement is not possible.

Due to the complexity of the problem, no method for improving the dielectric strength of polyvinylidene fluoride films has been reported.

SUMMARY OF THE INVENTION

A principal object of the present invention is to provide a polyvinylidene fluoride film having high dielectric strength.

Another object of the present invention is to provide a polyvinylidene fluoride film having a dielectric strength of at least 10 MV/cm at room temperature and at least 8 MV/cm at 100° C.

A further object of the present invention is to provide a polyvinylidene fluoride film having piezoelectric and pyroelectric properties and which is less subject to dielectric breakdown.

The present invention provides a polyvinylidene fluoride film having high dielectric strength and a process for producing such a film by superimposing a dielectric polymer film on one or both surfaces of the polyvinylidene fluoride film while applying an electric field to the assembly under heating.

The invention is described below in detail.

DETAILED DESCRIPTION OF THE INVENTION

The dielectric polymer film laid over the polyvinylidene fluoride film in accordance with the present invention is a dielectric polymer film having a lower conductivity than the polyvinylidene fluoride film. [Conductivity in this application is measured according to ASTM D257-61. In this measurement, both surfaces of a test piece film is metallized with aluminum in an area having a diameter of 6 mm and the aluminum is used as the main electrode, a vibrating reed electrometer ("TR-84M", a product a Takeda Riken Industry Co., Ltd.) is used as a measurement instrucment and a battery "Model 410B" (a product of John Fluke Mfg. Co., Inc.) is used as a power supply.] If the conductivity of the dielectric polymer film is equal to, or higher than, that of the polyvinylidene fluoride film, the dielectric strength of the polyvinylidene fluoride film cannot be improved unless an electric field is applied for an excessively long period of time. Hence, such a dielectric polymer film as industrially undesirable.

Suitable dielectric polymer films include, for example, films of polyethylene, polypropylene, ionomer, polytrifluorochloroethylene (PTFCE), polycarbonate, polyimides, poly(methyl methacrylate), poly(ethyl methacrylate), poly(butyl methacrylate), poly(octyl methacrylate), polyethylene terephthalate, polystyrene, polyvinyl acetate, polyvinyl chloride, epoxide, polyacrylonitrile, polyoxymethylene, polyamides, polyvinylidene chloride, and ethylenevinyl acetate copolymer. Of these, polyethylene, polypropylene and polycarbonate films are especially preferred.

The dielectric polymer film is preferably as thin as possible because a higher electric field can be applied to the polyvinylidene fluoride film. However, too thin a film (having a thickness of less than $1\mu$) has reduced mechanical strength, it difficult to handle, and the effect of increasing dielectric strength is rather reduced. Most preferably, the dielectric polymer film has a thickness of at least $2\mu$ and is as thin as possible. There is no specific upper limit on the film thickness, as long as the film is soft so as to tightly adhere to the polyvinylidene fluoride. However, larger thicknesses markedly increase the voltage which must be applied. Therefore, the thickness of the film is generally about 2 mm or less, preferably about 1 mm or less, and most preferably about $100\mu$ or less.

The dielectric polymer film is laid on one or both surfaces of the polyvinylidene fluoride film. The effect of increasing dielectric strength is larger when it is laid on both sides of the polyvinylidene fluoride film.

An electric field is applied to the polyvinylidene fluoride film and the dielectric polymer film laminate while heating to increase the dielectric strength of the polyvinylidene fluoride film. The same techniques employed in the conventional production of electrets can be employed as a method for applying the electric field. For example, a so-called batch type method comprising tensioning a laminate film in a flat plane and applying a high voltage direct current to the laminate film using as electrodes electroconductive coatings deposited on both surfaces of the laminate film can be employed. In addition, a method comprising passing a laminate film of indefinite length through an electric field continuously wherein an electroconductive coating (electrode) is deposited on both surfaces of the laminate film and at least one electrode is partitioned by electrically insulating zones arranged perpendicular to the running direction of the film as disclosed in, for example, U.S. Pat. No. 3,985,914, can also be employed.

The field strength is at least 10 KV/cm and less than the dielectric strength of the polyvinylidene fluoride film and the overlying dielectric film, but preferably as close to their dielectric strength as possible. If the dielectric strength of the polyvinylidene fluoride film is smaller that that of the dielectric polymer film, the field strength must be less than the dielectric strength of the polyvinylidene fluoride film. On the other hand, if the dielectric strength of the polyvinylidene fluoride film is larger than that of the dielectric polymer film, the field strength must be less than the dielectric strength of the dielectric polymer film. From the standpoint of the objects of the present invention, the former embodiment is preferred. If the field strength is too close to the dielectric strength of the polyvinylidene fluoride film or the dielectric polymer film, discharge degradation and dielectric breakdown tend to occur. Therefore, it is preferable that the field strength is about 0.3 to 0.6 times the dielectric strength of the polyvinylidene fluoride film and the dielectric polymer film. According to the present invention, the dielectric strength of polyvinylidene fluoride film and dielectric polymer film gradually increases during the operation, so it is possible to increase the voltage applied with the increase in the dielectric strength.

The treating temperature is room temperature or higher, but lower than the temperature at which the polyvinylidene fluoride film or the dielectric film thermally decomposes. Application of the electric field is preferably performed under heating. The preferred treating temperature is lower than the melting point or the softening point of the films. The heating promotes movement of the main chain in the polymer constituting the film and, as a result, ionic impurities present therein are easily transferred upon the application of electric field and the movement of polymer main chain. However, if the heating temperature is too high, the film softens and the thickness thereof tends to change. Therefore, the heating temperature is preferably about 50° to 180° C., most preferably about 80° to 160° C. The treatment time, t (minutes), depends upon the thickness, d(microns), of the polyvinylidene fluoride. Preferably, $t \geq 7d$, more preferably $t \geq 10d$.

For most applications, the dielectric polymer film is removed from the polyvinylidene fluoride film after treatment with the electric field, however, in some cases the dielectric polymer film may be laminated to the polyvinylidene fluoride film prior to treatment and the polyvinylidene fluoride film is used as the laminate. The polyvinylidene fluoride films obtained under these conditions have a dielectric strength of at least 10 MV/cm at room temperature, and at least 8 MV/cm at 100° C. which are much higher than those of conventional polyvinylidene fluoride films (about 8 MV/cm at room temperature, and about 6 MV/cm at 100° C.).

The polyvinylidene fluoride, as referred to in this invention, denotes not only a homopolymer of vinylidene fluoride, but also copolymers comprising vinylidene fluoride as a main structural unit, i.e., at least 50% of the repeating units in the polymers are vinylidene fluoride, blends comprising at least 50% by weight of the homopolymer or copolymers, and compositions of these polymers comprising various additives. The polyvinylidene fluoride film, as referred to in this invention, may be an unoriented film or an oriented film and about 1 to 2000μ thick.

The following Examples illustrate the present invention.

EXAMPLE 1

A 5μ thick polypropylene film having one surface metallized with gold was laid on both surfaces of a biaxially oriented 12μ thick film of a vinylidene fluoride homopolymer, and they were set so that the metallized surface contacted an electrode. A voltage of 3.1 KV was applied at 100° C. for 4 hours to the film assembly such that an electric field of 500 KV/cm was applied to the polyvinylidene fluoride film. The polypropylene film was then removed. While the polyvinylidene fluoride film before the application of an electric field had a dielectric strength of 8 MV/cm at room temperature and 6 MV/cm at 100° C., the treated film had a dielectric strength of 12 MV/cm at room temperature and 10 MV/cm at 100° C.

The dielectric strength of the polyvinylidene fluoride film was measured as follows: Both surfaces of the polyvinylidene fluoride were metallized with gold to form an electrode. The electrode was interposed between a brass ball and a flat electrode, the voltage applied was elevated at a rate of 500 V/sec and the maximum voltage at which dielectric breakdown occurred was measured. The average of ten measured values was used as the dielectric strength.

EXAMPLE 2

A 5μ thick polycarbonate film having one surface metallized with gold was laid on both surface of a 40μ thick film of a copolymer of 95 parts by weight of vinylidene fluoride and 5 parts by weight of monochlorotrifluoroethylene, and they were set so that the metallized surface of the polycarbonate film contacted an electrode. A voltage of 3,666 V was applied at 100° C. to the film assembly so as to apply an electric field of 500 KV/cm to the vinylidene fluoride copolymer film. After this treatment the polycarbonate film was removed. While the vinylidene fluoride copolymer film before the application of an electric field had a dielectric strength of 8 MV/cm at room temperature, and 6 MV/cm at 100° C., the treated film showed a dielectric strength of 11 MV/cm at room temperature and 9 MV/cm at 100° C.

While the invention has been described in detail and with reference to specific embodiments thereof, it will be apparent to one skilled in the art that various changes and modifications can be made therein without departing from the spirit and scope thereof.

What is claimed is:

1. A polyvinylidene fluoride film having a high dielectric strength measured between a brass ball and a flat electrode of at least 10 MV/cm at room temperature and at least 8 MV/cm at 100° C.

2. A process for producing a polyvinylidene fluoride film having a high dielectric strength, which comprises laying a dielectric polymer film having a thickness of at least 1μ on one or both surfaces of a polyvinylidene fluoride film, said dielectric polymer film having a lower conductivity than the polyvinylidene fluoride film and having a dielectric strength equal to or larger than that of the polyvinylidene fluoride film; and applying an electric field of at least 10 KV/cm but less than the dielectric strength of the polyvinylidene fluoride film to these films at room temperature or higher but at a temperature lower than the temperature at which the polyvinylidene fluoride film or the dielectric polymer film thermally decompose until the dielectric strength of the polyvinylidene fluoride film measured between a brass ball and a flat electrode is at least 10 MV/cm at room temperature and at least 8 MV/cm at 100° C.

3. The process of claim 2, wherein said dielectric polymer film is about 2 to 100 microns thick.

4. The process of claim 2, wherein said temperature is about 50° to 180° C.

5. The process of claim 2, wherein the temperature is lower than the melting point or the softening point of the film.

6. The process of claim 2, wherein after the application of the electric field, the dielectric polymer film is removed from the polyvinylidene fluoride film.

7. The process of claim 2, wherein said dielectric polymer film is a film of polyethylene, polypropylene, ionomer, polytrifluorochloroethylene (PTFCE), polycarbonate, polyimides, poly(methyl methacrylate), poly(butyl methacrylate), poly(octyl methacrylate), polyethylene terephthalate, polystyrene, polyvinyl acetate, polyvinyl chloride, epoxide, polyacrylonitrile, polyoxymethylene, polyamides, polyvinylidene chloride, and ethylene-vinyl acetate copolymer.

8. The process of claim 7, wherein said dielectric polymer film is a film of polyethylene, polypropylene or polycarbonate.

9. The process of claim 2, wherein the electric field is applied during a treatment time $t \geq 7d$, wherein t is treatment time in minutes and d is thickness in microns of the polyvinylidene fluoride film.

10. The process of claim 9, wherein $t \geq 10d$.

11. The polyvinylidene fluoride film of claim 1, wherein said film is prepared by the process of claim 2.

12. The polyvinylidene fluoride film of claim 11, wherein said dielectric polymer film is about 2 to 100 microns thick.

13. The polyvinylidene fluoride film of claim 11, wherein said temperature is about 50° to 180° C.

14. The polyvinylidene fluoride film of claim 11, wherein said dielectric polymer film is a film of polyethylene, polypropylene, ionomer, polytrifluorochloroethylene (PTFCE), polycarbonate, polyimides, poly(methyl methacrylate), poly(ethyl methacrylate), poly(butyl methacrylate), poly(octyl methacrylate, polyethylene terephthalate, polystyrene, polyvinyl acetate, polyvinyl chloride, epoxide, polyacrylonitrile, polyoxymethylene, polyamides, polyvinylidene chloride, and ethylene-vinyl acetate copolymer.

15. The polyvinylidene filuoride film of claim 14, wherein said dielectric polymer film is a film of polyethylene, polypropylene or polycarbonate.

* * * * *